US008445366B2

(12) United States Patent
Lee et al.

(10) Patent No.: US 8,445,366 B2
(45) Date of Patent: May 21, 2013

(54) ELECTRON BEAM ANNEALING APPARATUS AND ANNEALING METHODS USING THE SAME

(75) Inventors: Jung-hyun Lee, Suwon-si (KR);
Jong-min Kim, Suwon-si (KR);
Dong-joon Ma, Anyang-si (KR);
Chang-soo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 841 days.

(21) Appl. No.: 12/457,916

(22) Filed: Jun. 25, 2009

(65) Prior Publication Data

US 2010/0147807 A1  Jun. 17, 2010

(30) Foreign Application Priority Data

Dec. 15, 2008  (KR) ........................ 10-2008-0127268

(51) Int. Cl.
*H01L 21/428*  (2006.01)
*H01L 21/477*  (2006.01)

(52) U.S. Cl.
USPC ... 438/487; 438/795; 250/492.3; 219/121.16; 219/121.33

(58) Field of Classification Search
USPC .......... 219/121.16, 121.17, 121.33; 438/486, 438/487, 795; 250/492.3; 117/905
See application file for complete search history.

(56) References Cited

U.S. PATENT DOCUMENTS

| | | | | | |
|---|---|---|---|---|---|
| 2,968,723 | A | * | 1/1961 | Steigerwald | 250/400 |
| 4,382,186 | A | * | 5/1983 | Denholm et al. | 250/492.2 |
| 4,562,332 | A | * | 12/1985 | Walter et al. | 219/121.35 |
| 5,091,820 | A | * | 2/1992 | Iwaya et al. | 361/304 |
| 5,910,019 | A | * | 6/1999 | Watanabe et al. | 438/488 |
| 5,989,969 | A | * | 11/1999 | Watanabe et al. | 438/381 |
| 6,849,831 | B2 | * | 2/2005 | Timans et al. | 219/390 |
| 7,419,860 | B2 | * | 9/2008 | Shinagawa et al. | 438/166 |
| 7,592,191 | B2 | * | 9/2009 | Rose et al. | 438/20 |
| 7,902,052 | B2 | * | 3/2011 | Im | 438/487 |
| 8,034,698 | B2 | * | 10/2011 | Im | 438/487 |
| 2003/0087503 | A1 | * | 5/2003 | Sakaguchi et al. | 438/406 |
| 2004/0118347 | A1 | | 6/2004 | Groves et al. | |
| 2005/0072753 | A1 | * | 4/2005 | Koops et al. | 216/2 |

FOREIGN PATENT DOCUMENTS

| | | | | |
|---|---|---|---|---|
| FR | 2909368 | A1 | * | 6/2008 |
| JP | 58156591 | A | * | 9/1983 |
| JP | 63232338 | A | * | 9/1988 |
| JP | 02258669 | A | * | 10/1990 |
| JP | 04022127 | A | * | 1/1992 |
| JP | 08165563 | A | * | 6/1996 |
| JP | 09064030 | A | * | 3/1997 |
| JP | 09148267 | A | * | 6/1997 |
| JP | 11-072599 | | | 3/1999 |
| JP | 2004-001086 | | | 1/2004 |
| JP | 2007-005011 | | | 1/2007 |
| JP | 2007-314845 | | | 12/2007 |
| JP | 2008-053665 | | | 3/2008 |

* cited by examiner

*Primary Examiner* — Samuel M Heinrich
(74) *Attorney, Agent, or Firm* — Harness, Dickey & Pierce, P.L.C.

(57) ABSTRACT

Electron beam annealing apparatuses for annealing a thin layer on a substrate and annealing methods using the apparatuses are provided. The electron beam annealing apparatuses may include an electron beam scanning unit that may scan a pulsed electron beam onto a substrate.

19 Claims, 3 Drawing Sheets

TIME

ELECTRON BEAM ANNEALING APPARATUS AND ANNEALING METHODS USING THE SAME

CROSS-REFERENCE TO RELATED APPLICATIONS

This application claims priority under 35 U.S.C. §119 to Korean Patent Application No. 10-2008-0127268, filed on Dec. 15, 2008, in the Korean Intellectual Property Office (KIPO), the entire contents of which is incorporated herein by reference.

BACKGROUND

1. Field

Example embodiments relate to electron beam annealing apparatuses and annealing methods using the same.

2. Description of the Related Art

After a thin layer is deposited on a substrate an annealing process is usually performed on the deposited thin layer. An annealing process refers to activation of the thin layer by heating the substrate on which the thin layer is deposited. Using an annealing process, a silicon thin layer may be recrystallized, impurities in a metal thin layer may be removed, and/or oxygen required in an oxide thin layer may be supplied.

An annealing process that is performed on a deposited thin layer may be classified into thermal annealing and laser annealing. In thermal annealing, a substrate on which a thin layer is deposited may be heated to activate the thin layer. However, in thermal annealing, the substrate may be required to endure high temperature processing. In laser annealing, a pulsed laser may be scanned onto a substrate to locally heat desired regions of the deposited thin layer on the substrate in order to activate a thin layer. However, in laser annealing, a thin layer functioning as a heat reservoir may be required under the thin layer that is to be activated in order to absorb laser energy and when a large-sized substrate is used, the amount of optical equipment for laser focusing may be increased, thereby increasing the costs. Additionally, the deposited thin layer may be deformed.

SUMMARY

Example embodiments include electron beam annealing apparatuses and annealing methods using the electron beam annealing apparatuses.

Example embodiments include an electron beam annealing apparatus including an electron beam scanning unit configured to scan a pulsed electron beam onto a substrate during an annealing process.

According to example embodiments, the apparatus may include a chamber configured to mount the substrate including a thin layer that is on the substrate and to supply a reaction gas. The apparatus may include a reaction gas delivery unit configured to continuously supply a uniform amount of the reaction gas to the chamber during an annealing process. The chamber may be configured to mount the substrate including a deposited thin layer that may be a reductive thin layer. The reaction gas delivery unit may be configured to supply the reaction gas that may include $H_2$ and/or $NH_3$. The chamber may be configured to mount the substrate including a deposited thin layer that may be an oxide thin layer. The reaction gas delivery unit may be configured to supply the reaction gas that may include $O_2$ or $N_2O$. The apparatus may further include a bias applying unit configured to apply a bias voltage to the substrate. The bias applying unit may be configured to continuously apply a bias voltage to the substrate during an annealing process.

Example embodiments include an electron beam annealing method including scanning a pulsed electron beam onto a substrate.

The method may include supplying a reaction gas into a chamber including the substrate. A uniform amount of the reaction gas may be continuously supplied to the chamber during an annealing process. The method may include applying a bias voltage to the substrate. The bias voltage may be uniformly and continuously applied to the substrate during the annealing process.

BRIEF DESCRIPTION OF THE DRAWINGS

Example embodiments will be more clearly understood from the following brief description taken in conjunction with the accompanying drawings.

FIG. 1 is a schematic view illustrating an electron beam annealing apparatus according to example embodiments;

FIG. 2 is a graph of electron beam pulses as a function of time according to example embodiments;

FIG. 3 is a graph of bias voltage as a function of time according to example embodiments;

FIG. 4 is a scanning electron microscope (SEM) image of a laser annealed silicon thin layer; and FIG. 5 is a SEM image of an electron beam annealed silicon thin layer according to example embodiments.

Figure 1:
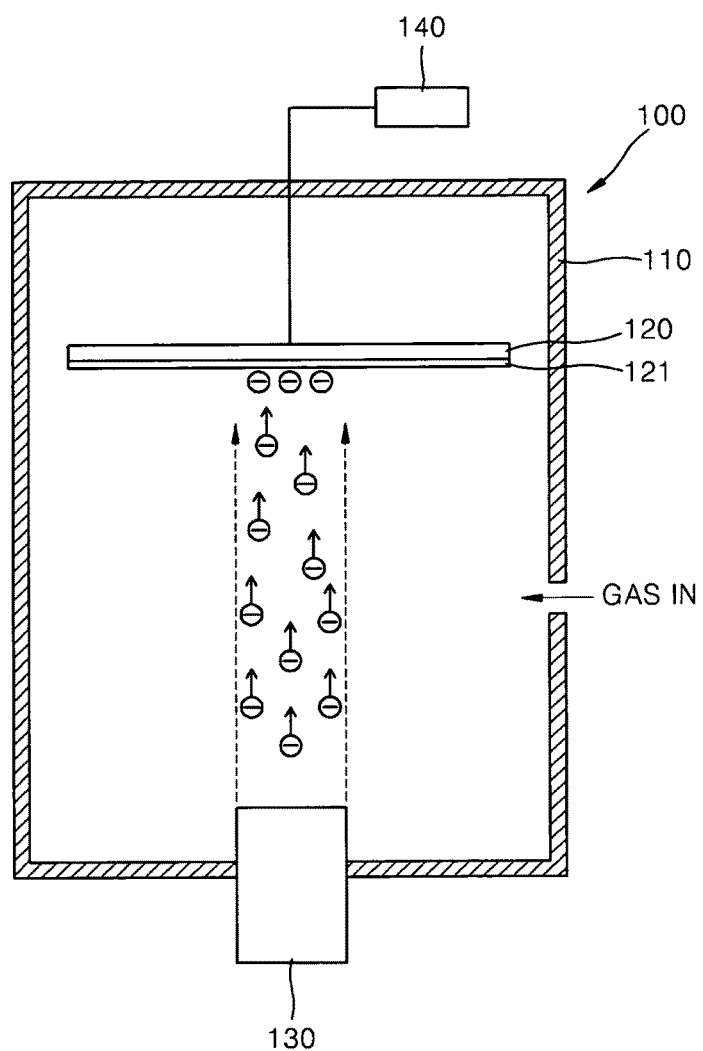
FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic view illustrating an electron beam annealing apparatus according to example embodiments. Referring to FIG. 1, the electron beam annealing apparatus 100 may include an electron beam scanning unit 130. The electron beam scanning unit 130 may include, for example, a plasma generating reactor, a first lens extracting desired electrons from the plasma, and a second lens focusing electron beams that have passed through the first lens. However, the electron beam scanning unit 130 is not limited thereto. The electron beam scanning unit 130 may scan an electron beam onto a region of a substrate 120. The substrate 120 may be in a chamber 110 and a thin layer 121 may be on the substrate 120. The thin layer 121 may be, for example, a deposited thin layer.

Figure 2:
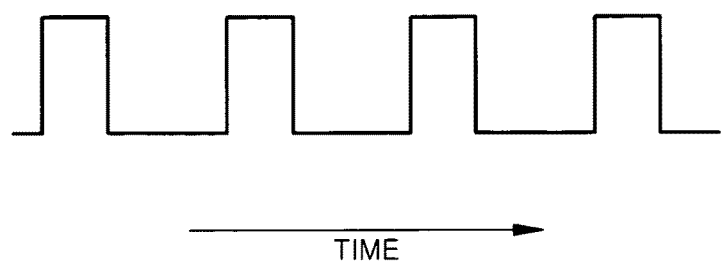

FIG. 2 is a graph of electron beam pulses as a function of time according to example embodiments. Referring to FIGS. 1 and 2, the electron beam scanning unit 130 may scan electron beam pulses onto the substrate 120 to anneal the thin layer 121. When a substrate 120 is continuously scanned by an electron beam for the purpose of annealing, electrons may build up on the thin layer 121 and the deposited thin layer on the substrate 120 may be heated to an excessive temperature. In order to prevent or reduce excessive substrate heating, according to example embodiments, the electron beam scanning unit 130 may scan electrons using electron beam pulses rather than a continuous electron beam. When electron beam pulses are scanned onto a desired region of the substrate 120 by the electron beam scanning unit 130, the deposited thin layer on the substrate 120 may be heated to an anneal temperature, thereby activating the material of the thin film 121. The anneal temperature may be predetermined.

According to example embodiments, a reaction gas may be supplied to the chamber 110 during the annealing process. A uniform amount of the reaction gas may be continuously supplied to the chamber 110 during the annealing process from a reaction gas delivery unit. The reaction gas delivery unit may supply reaction gas, for example, via GAS IN. The reaction gas may be radicalized by scanned electrons of the electron beam scanning unit 130 and may improve the activation process of the thin layer 121. When the thin layer 121 is a reductive thin film (e.g., a metal thin film) the reaction gas may contain, for example, $H_2$ or $NH_3$. When the layer 121 is an oxide thin layer (e.g., a silicon oxide thin layer) the reaction gas may contain, for example, $O_2$ or $N_2O$.

Figure 3:
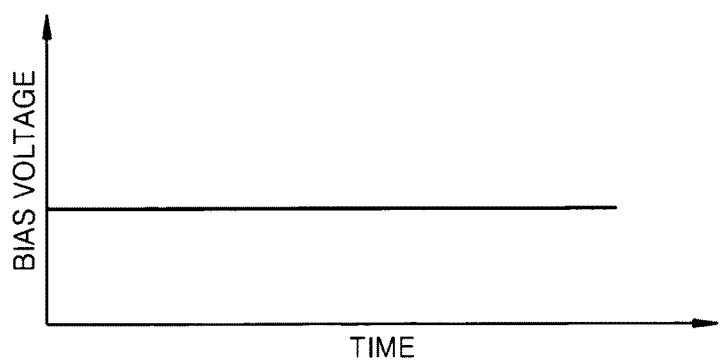

The electron beam annealing apparatus 100 may include a bias applying unit 140 that may apply a bias voltage to the substrate 120. The bias voltage may induce electron beams onto the substrate 120. FIG. 3 is a graph of bias voltage as a function of time according to example embodiments. Referring to FIGS. 1 and 3, the bias applying unit 140 may continuously apply a uniform bias voltage to the substrate 120 during the annealing process.

A method of annealing will now be described with reference to FIGS. 1-3. A thin layer 121 may be deposited on a substrate 120. The substrate 120 including the thin layer 121 may be mounted in a chamber 110 of the electron beam annealing apparatus 100. A pulsed electron beam may be scanned onto and/or across a desired region of the substrate 120 using the electron beam scanning unit 130. A uniform amount of a reaction gas may be continuously supplied to the chamber 110. A uniform bias voltage may be continuously applied to the substrate 120 by the bias applying unit 140. The substrate 120 may be heated to an anneal temperature by the annealing process and the material of the deposited thin layer 121 on the heated substrate 120 may thereby be activated.

Figure 4:
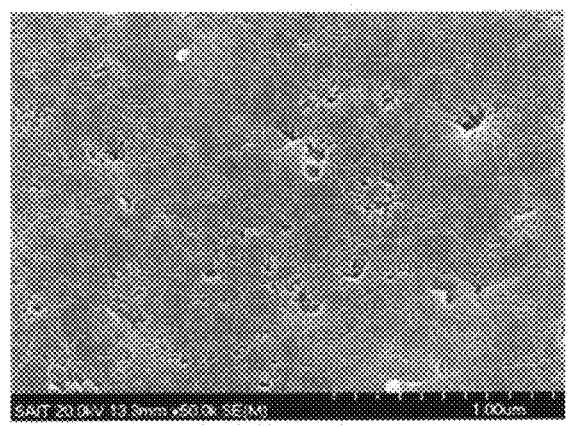

FIG. 4 is a scanning electron microscope (SEM) image of a laser annealed silicon thin layer. Laser energy may be used for localized heating of a substrate in a laser annealing method. However, when a thin layer is melted by a laser, seeding may be generated in a low temperature area of the melted thin layer prior to recrystallization and the thin layer may be prone to deformation. As illustrated in FIG. 4, when a silicon thin layer is recrystallized using a laser annealing method a surface of the thin layer may become rough.

Figure 5:
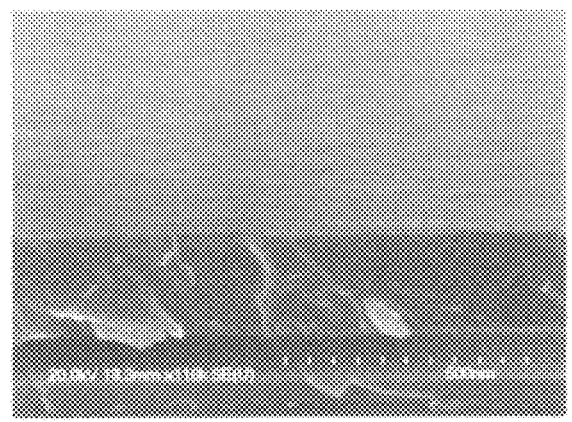

FIG. 5 is a SEM image illustrating an electron beam annealed silicon thin layer according to example embodiments. $H_2$ may be used as a reaction gas supplied to the chamber. In the electron beam annealing method according to example embodiments, silicon bonds may be broken by the energy of electrons and uniform rearrangement of the silicon bonds may be achieved in the thin layer. Accordingly, recrystallization of the thin layer may be induced with minimized or reduced deformation of the thin layer. As illustrated in FIG. 5, when a silicon thin layer is recrystallized using an electron beam annealing method according to example embodiments, the surface of a thin layer may be smooth.

According to example embodiments, a pulsed electron beam of an electron beam annealing apparatus may be scanned onto a substrate in order to activate a thin layer on the substrate. In order to improve the activation process, a reaction gas may be supplied into a chamber of the electron beam annealing apparatus and/or a bias voltage may be applied to the substrate. Electron beam annealing to activate a thin layer may prevent or reduce damage to either the thin layer and/or the substrate.

While example embodiments have been particularly shown and described, it will be understood by one of ordinary skill in the art that variations in form and detail may be made therein without departing from the spirit and scope of the claims.

What is claimed is:

1. An electron beam annealing apparatus, comprising:
   a chamber configured to mount a substrate including a thin layer on the substrate and to supply a reaction gas; and
   an electron beam scanning unit configured to scan a pulsed electron beam to the reaction gas so as to radicalize the reaction gas and onto the thin layer on the substrate during an annealing process so as to heat the thin layer to an annealing temperature that recrystallizes a surface of the thin layer.

2. The electron beam annealing apparatus of claim 1, wherein the electron beam scanning unit is configured to scan the pulsed electron beam onto the thin layer on the substrate so as to heat the thin layer to the annealing temperature that recrystallizes the thin layer to form a crystallized layer on the substrate.

3. The electron beam annealing apparatus of claim 1, further comprising a reaction gas delivery unit configured to continuously supply a uniform amount of the reaction gas to the chamber during the annealing process.

4. The electron beam annealing apparatus of claim 1, wherein the thin layer is a deposited reductive thin layer, and the reaction gas includes at least one of $H_2$ and $NH_3$.

5. The electron beam annealing apparatus of claim 1, wherein the thin layer is a deposited oxide thin layer, and the reaction gas includes at least one of $O_2$ and $N_2O$.

6. The electron beam annealing apparatus of claim 1, further comprising a bias applying unit configured to apply a bias voltage to the substrate.

7. The electron beam annealing apparatus of claim 6, wherein the bias applying unit is configured to continuously apply a bias voltage to the substrate during an annealing process.

8. An electron beam annealing apparatus, the apparatus comprising:
   a chamber configured to mount a substrate including a thin layer on the substrate and to supply a reaction gas into the chamber;
   an electron beam scanning unit configured to scan a pulsed electron beam to the reaction gas so as to radicalize the reaction gas and onto the thin layer on the substrate so as to heat the thin layer to an annealing temperature that recrystallizes a surface of the thin layer; and
   a bias applying unit configured to apply a bias voltage to the substrate.

9. The electron beam annealing apparatus of claim 8, further comprising:
   a reaction gas delivery unit configured to continuously supply the reaction gas into the chamber during an annealing process, wherein
   the bias applying unit is configured to continuously apply a bias voltage to the substrate during the annealing process.

10. An electron beam annealing method, the method comprising:
    scanning a pulsed electron beam onto a substrate including a thin layer on substrate so as to heat the thin layer to an annealing temperature that induces recrystallization of a surface of the thin layer; and
    supplying a radicalized reaction gas to the substrate including the thin layer using electrons from the pulsed electron beam and a reaction gas.

11. The method of claim 10, wherein the supplying the radicalized reaction gas includes supplying the reaction gas into a chamber including the substrate.

12. The method of claim 11, wherein a uniform amount of the reaction gas is continuously supplied to the chamber during an annealing process.

13. The method of claim 11, wherein the substrate includes a deposited reductive thin layer, and
    the reaction gas including at least one of $H_2$ or $NH_3$.

14. The method of claim 11, wherein the substrate includes a deposited oxide thin layer, and
    the reaction gas includes at least one of $O_2$ or $N_2O$.

15. The method of claim 12, further comprising applying a bias voltage to the substrate.

16. The method of claim 15, wherein the bias voltage is uniformly and continuously applied to the substrate during the annealing process.

17. An electron beam annealing method for annealing a thin layer deposited on a substrate, the method comprising:
    mounting the substrate in a chamber;
    scanning a pulsed electron beam onto the thin layer on the substrate so as to heat the thin layer to an annealing temperature that induces recrystallization of a surface of the thin layer;
    supplying a reaction gas to the chamber, wherein the pulsed electron beam radicalizes the reaction gas; and
    applying a bias voltage to the substrate.

18. The method of claim 17, wherein the reaction gas is continuously supplied to the chamber during an annealing process, and
    the bias voltage is continuously and uniformly applied to the substrate during the annealing process.

19. The method of claim 10, wherein the scanning the pulsed electron beam onto the thin layer on the substrate so as to heat the thin layer to the annealing temperature includes induces recrystallization of the thin layer to form a crystallized layer on the substrate.

* * * * *